US007506226B2

(12) United States Patent
Gajapathy et al.

(10) Patent No.: US 7,506,226 B2
(45) Date of Patent: Mar. 17, 2009

(54) SYSTEM AND METHOD FOR MORE EFFICIENTLY USING ERROR CORRECTION CODES TO FACILITATE MEMORY DEVICE TESTING

(75) Inventors: Partha Gajapathy, McKinney, TX (US); Todd Dauenbaugh, Richardson, TX (US)

(73) Assignee: Micron Technology, Inc., Boise, ID (US)

( * ) Notice: Subject to any disclaimer, the term of this patent is extended or adjusted under 35 U.S.C. 154(b) by 383 days.

(21) Appl. No.: 11/439,636

(22) Filed: May 23, 2006

(65) Prior Publication Data

US 2007/0277066 A1   Nov. 29, 2007

(51) Int. Cl.
*G11C 29/00*   (2006.01)
(52) U.S. Cl. .................. 714/718; 714/724; 714/719; 714/720; 714/5; 714/42; 714/723; 714/733; 714/734; 714/735; 714/742; 714/746; 714/764; 714/799; 365/185.09; 365/201
(58) Field of Classification Search ...................... None
See application file for complete search history.

(56) References Cited

U.S. PATENT DOCUMENTS

| | | | | |
|---|---|---|---|---|
| 4,005,405 A | 1/1977 | West | ...................... | 340/146.1 |
| 4,084,236 A | 4/1978 | Chelberg et al. | ............. | 364/200 |
| 4,139,148 A | 2/1979 | Scheuneman et al. | ........ | 235/312 |
| 4,201,337 A | 5/1980 | Lewis et al. | .................... | 371/37 |
| 4,241,446 A | 12/1980 | Trubisky | ...................... | 371/37 |
| 4,319,357 A | 3/1982 | Bossen | .......................... | 371/38 |
| 4,336,612 A | 6/1982 | Inoue et al. | ................... | 371/39 |
| 4,453,251 A | 6/1984 | Osman | ......................... | 371/51 |
| 4,464,755 A | 8/1984 | Stewart et al. | ................. | 371/51 |
| 4,498,178 A | 2/1985 | Ohhashi | ...................... | 371/37 |
| 4,589,112 A | 5/1986 | Karim | .......................... | 371/37 |
| 4,604,748 A | 8/1986 | Sato | ............................. | 371/38 |
| 4,604,750 A | 8/1986 | Manton et al. | ................. | 371/38 |
| 4,617,664 A | 10/1986 | Aichelmann, Jr. et al. | ..... | 371/38 |
| 4,646,304 A | 2/1987 | Fossati et al. | ................. | 371/38 |
| 4,646,312 A | 2/1987 | Goldsbury et al. | ............ | 371/38 |
| 4,651,321 A | 3/1987 | Woffinden et al. | ............ | 371/38 |
| 4,660,199 A | 4/1987 | Maeda et al. | ................. | 371/36 |
| 4,661,955 A | 4/1987 | Arlington et al. | ............. | 371/38 |
| 4,689,792 A * | 8/1987 | Traynor | ...................... | 714/753 |
| 4,710,934 A | 12/1987 | Traynor | ...................... | 371/38 |
| 4,775,979 A | 10/1988 | Oka | ............................. | 371/39 |
| 4,782,490 A | 11/1988 | Tenengolts | ................... | 371/40 |
| 4,852,100 A | 7/1989 | Christensen et al. | .......... | 371/38 |

(Continued)

*Primary Examiner*—John P Trimmings
(74) *Attorney, Agent, or Firm*—Dorsey & Whitney LLP

(57) ABSTRACT

A memory device includes an ECC and test circuit. In a normal mode, the circuit performs ECC conventional functions. In a test mode, the least significant bit of received data is used to generate test data. If the received bit is "0," the test data bits are all "0," and if the received bit is "1," the test data bits are all "1." The test data bits are applied to the ECC encoder that is used in normal operation. The ECC encoder is designed so that it generates ECC bits that have the same logic level as the test data bits. The test data bits and ECC bits are then written to a memory array and subsequently read. During the test mode, a logic circuit determines if the read data and check bits are all either "0" or "1" and outputs a corresponding test result bit from the memory device.

60 Claims, 7 Drawing Sheets

U.S. PATENT DOCUMENTS

| | | | | |
|---|---|---|---|---|
| 4,875,212 | A | 10/1989 | Hashimoto | 371/40.2 |
| 4,903,268 | A | 2/1990 | Hidaka et al. | 371/40.1 |
| 4,918,692 | A | 4/1990 | Hidaka et al. | 371/2.2 |
| 4,926,426 | A | 5/1990 | Scheuneman et al. | 371/40.1 |
| 4,961,192 | A | 10/1990 | Grimes | 371/37.1 |
| 4,993,028 | A | 2/1991 | Hillis | 371/39.1 |
| 5,010,554 | A | 4/1991 | Bechtel et al. | 371/37.1 |
| 5,056,095 | A | 10/1991 | Horiguchi et al. | 371/40.1 |
| 5,058,116 | A | 10/1991 | Chao et al. | 371/40.2 |
| 5,146,461 | A | 9/1992 | Duschatko et al. | 371/40.1 |
| 5,173,905 | A | 12/1992 | Parkinson et al. | 371/40.1 |
| 5,325,364 | A | 6/1994 | Ouchi et al. | 371/13 |
| 5,337,317 | A | 8/1994 | Takamisawa et al. | 371/40.4 |
| 5,357,529 | A * | 10/1994 | Tatosian et al. | 714/723 |
| 5,383,205 | A | 1/1995 | Makihara et al. | 371/40.1 |
| 5,465,262 | A | 11/1995 | Dell et al. | 371/49.3 |
| 5,490,155 | A | 2/1996 | Abdoo et al. | 371/40.1 |
| 5,491,700 | A | 2/1996 | Wright et al. | 371/37.8 |
| 5,533,189 | A | 7/1996 | Cheong et al. | 395/182.04 |
| 5,555,250 | A | 9/1996 | Walker et al. | 371/40.1 |
| 5,581,567 | A | 12/1996 | Chen et al. | 371/40.1 |
| 5,588,010 | A | 12/1996 | Hardell, Jr. et al. | 371/37.6 |
| 5,598,422 | A | 1/1997 | Longwell et al. | 371/37.1 |
| 5,633,882 | A | 5/1997 | Babb et al. | 371/40.1 |
| 5,691,996 | A | 11/1997 | Chen et al. | 371/51.1 |
| 5,699,369 | A | 12/1997 | Guha | 371/41 |
| 5,729,497 | A | 3/1998 | Pawlowski | 365/200 |
| 5,751,744 | A | 5/1998 | Babb | 371/49.1 |
| 5,751,745 | A | 5/1998 | Chen et al. | 371/51.1 |
| 5,754,753 | A | 5/1998 | Smelser | 395/182.06 |
| 5,757,823 | A | 5/1998 | Chen et al. | 371/37.01 |
| 5,761,221 | A | 6/1998 | Baat et al. | 371/40.12 |
| 5,768,294 | A | 6/1998 | Chen et al. | 371/37.1 |
| 5,781,568 | A | 7/1998 | Hsieh | 371/40.12 |
| 5,841,795 | A | 11/1998 | Olarig et al. | 371/40.13 |
| 5,864,569 | A | 1/1999 | Roohparvar | 371/40.18 |
| 5,920,580 | A | 7/1999 | Mick | 371/40.3 |
| 5,922,080 | A | 7/1999 | Olarig | 714/767 |
| 5,923,682 | A * | 7/1999 | Seyyedy | 714/773 |
| 5,935,263 | A | 8/1999 | Keeth et al. | 714/718 |
| 5,951,708 | A | 9/1999 | Yoshida | 714/752 |
| 5,956,351 | A | 9/1999 | Bossen et al. | 371/37.6 |
| 5,959,914 | A | 9/1999 | Gates et al. | 365/201 |
| 5,978,953 | A | 11/1999 | Olarig | 714/768 |
| 6,003,144 | A | 12/1999 | Olarig et al. | 714/42 |
| 6,024,485 | A | 2/2000 | Yoshida | 371/37.11 |
| 6,024,486 | A | 2/2000 | Olarig et al. | 371/40.11 |
| 6,041,430 | A | 3/2000 | Yamauchi | 714/752 |
| 6,052,820 | A | 4/2000 | Yoshida | 714/781 |
| 6,058,056 | A * | 5/2000 | Beffa et al. | 365/201 |
| 6,085,339 | A | 7/2000 | Jeddeloh | 714/52 |
| 6,085,348 | A | 7/2000 | Shimizu | 714/755 |
| 6,163,863 | A * | 12/2000 | Schicht | 714/718 |
| 6,178,537 | B1 | 1/2001 | Roohparvar | 714/773 |
| 6,209,113 | B1 | 3/2001 | Roohparvar | 714/773 |
| 6,272,651 | B1 | 8/2001 | Chin et al. | 714/43 |
| 6,279,072 | B1 | 8/2001 | Williams et al. | 711/105 |
| 6,282,689 | B1 * | 8/2001 | Seyyedy | 714/773 |
| 6,295,617 | B1 * | 9/2001 | Sonobe | 714/718 |
| 6,295,618 | B1 | 9/2001 | Keeth | 714/718 |
| 6,311,299 | B1 * | 10/2001 | Bunker | 714/719 |
| 6,331,948 | B2 | 12/2001 | Kasai et al. | 365/185.09 |
| 6,367,046 | B1 | 4/2002 | Chapman et al. | 714/752 |
| 6,418,072 | B2 * | 7/2002 | Nakaya et al. | 365/201 |
| 6,505,318 | B1 | 1/2003 | Quach et al. | 714/746 |
| 6,510,537 | B1 | 1/2003 | Lee | 714/763 |
| 6,519,734 | B1 | 2/2003 | Bodnar et al. | 714/761 |
| 6,662,333 | B1 | 12/2003 | Zhang et al. | 714/767 |
| 6,675,349 | B1 | 1/2004 | Chen | 714/804 |
| 6,678,860 | B1 * | 1/2004 | Lee | 714/763 |
| 6,701,480 | B1 | 3/2004 | Karpuszka et al. | 714/764 |
| 6,714,253 | B2 | 3/2004 | Kim et al. | 348/556 |
| 6,751,769 | B2 | 6/2004 | Chen et al. | 714/767 |
| 6,779,148 | B2 | 8/2004 | Tanaka | 714/753 |
| 6,819,611 | B2 * | 11/2004 | Keeth | 365/205 |
| 6,838,331 | B2 | 1/2005 | Klein | 438/238 |
| 6,839,875 | B2 | 1/2005 | Roohparvar | 714/773 |
| 6,879,504 | B1 | 4/2005 | Lien et al. | 365/49 |
| 6,888,769 | B2 | 5/2005 | Kirsch | 365/205 |
| 6,920,601 | B1 | 7/2005 | Stern et al. | 714/785 |
| 6,934,895 | B2 * | 8/2005 | Yun | 714/718 |
| 6,968,491 | B1 | 11/2005 | Yang et al. | 714/752 |
| 6,973,613 | B2 | 12/2005 | Cypher | 714/773 |
| 6,987,684 | B1 | 1/2006 | Branth et al. | 365/49 |
| 6,990,625 | B2 | 1/2006 | Fujiwara et al. | 714/788 |
| 7,051,265 | B2 | 5/2006 | Tsao et al. | 714/767 |
| 7,065,697 | B2 | 6/2006 | Briggs et al. | 714/767 |
| 7,079,430 | B2 | 7/2006 | Yen et al. | 365/200 |
| 7,093,182 | B2 | 8/2006 | Dickson | 714/785 |
| 7,096,414 | B2 | 8/2006 | Das Sharma | 714/800 |
| 7,134,069 | B1 | 11/2006 | Longwell et al. | 714/800 |
| 7,137,057 | B2 | 11/2006 | Williams | 714/774 |
| 7,143,329 | B1 | 11/2006 | Trimberger et al. | 714/746 |
| 7,325,173 | B2 * | 1/2008 | Kikutake et al. | 714/703 |
| 2004/0199860 | A1 | 10/2004 | Kim et al. | 714/801 |

* cited by examiner

| D0 | D1 | D2 | D3 | D4 | D5 | D6 | D7 | P0 | P1 | P2 | P3 |
|----|----|----|----|----|----|----|----|----|----|----|----|
|    |    |    |    |    |    |    |    |    |    |    |    |
| 1  | 1  | 0  | 1  | 1  | 0  | 1  | 0  | 1  | 0  | 0  | 0  |
| 1  | 0  | 1  | 1  | 0  | 1  | 1  | 0  | 0  | 1  | 0  | 0  |
| 0  | 1  | 1  | 1  | 0  | 0  | 0  | 1  | 0  | 0  | 1  | 0  |
| 0  | 0  | 0  | 0  | 1  | 1  | 1  | 1  | 0  | 0  | 0  | 1  |

ORIGINAL PARITY TABLE FOR 8,4 HAMMING CODE

FIGURE 1A

PRIOR ART

PARITY EQUATIONS:

P0: $D0 \oplus D1 \oplus D3 \oplus D4 \oplus D6$

P1: $D0 \oplus D2 \oplus D3 \oplus D5 \oplus D6$

P2: $D1 \oplus D2 \oplus D3 \oplus D7$

P3: $D4 \oplus D5 \oplus D6 \oplus D7$

FIGURE 1B

PRIOR ART

| D0 | D1 | D2 | D3 | D4 | D5 | D6 | D7 | P0 | P1 | P2 | P3 |
|---|---|---|---|---|---|---|---|---|---|---|---|
| 1 | 1 | 0 | 1 | 0 | 1 | 1 | 0 | 1 | 0 | 0 | 0 |
| 0 | 1 | 1 | 1 | 0 | 0 | 1 | 1 | 0 | 1 | 0 | 0 |
| 1 | 1 | 0 | 0 | 1 | 1 | 0 | 1 | 0 | 0 | 1 | 0 |
| 1 | 1 | 1 | 1 | 1 | 0 | 0 | 0 | 0 | 0 | 0 | 1 |

REVISED PARITY TABLE FOR 8,4 HAMMING CODE

FIGURE 3A

REVISED PARITY EQUATIONS:

P0: $D0 \oplus D1 \oplus D3 \oplus D5 \oplus D6$

P1: $D1 \oplus D2 \oplus D3 \oplus D6 \oplus D7$

P2: $D0 \oplus D1 \oplus D4 \oplus D5 \oplus D7$

P3: $D0 \oplus D1 \oplus D2 \oplus D3 \oplus D4$

FIGURE 3B

SYSTEM AND METHOD FOR MORE EFFICIENTLY USING ERROR CORRECTION CODES TO FACILITATE MEMORY DEVICE TESTING

TECHNICAL FIELD

This invention relates generally to the testing of semiconductor memories, and more specifically to a method and circuit for performing compression to reduce the time for testing memory cells in a semiconductor memory.

BACKGROUND OF THE INVENTION

During the manufacture of semiconductor memories, such as synchronous dynamic random access memories ("SDRAMs"), it is necessary to test each memory to ensure it is operating properly. Electronic and computer systems containing semiconductor memories also normally test the memories when power is initially applied to the system. A typical SDRAM includes a number of arrays, each array including a number of memory cells arranged in rows and columns. During testing of the SDRAM, each memory cell must be tested to ensure it is operating properly. In a typical prior art test method, data having a first binary value (e.g., a "1") is written to and read from all memory cells in the arrays, and thereafter data having a different binary value (e.g., a "0") is typically written to and read from the memory cells. A memory cell is determined to be defective when the data written to the memory cell does not equal that read from the memory cell. As understood by one skilled in the art, other test data patterns may be utilized in testing the memory cells, such as an alternating bit pattern "101010 . . . 0" written to the memory cells in each row of the arrays.

In a typical test configuration, an automated memory tester is coupled to address, data, and control buses of the SDRAM, and applies signals to these buses to perform the desired tests. As the storage capacity of SDRAM and other memory devices increase, the number of memory cells and hence the number of data transfer operations the tester must perform correspondingly increases. For example, in a memory array having n rows and m columns of memory cells, the tester performs n*m cell accesses in writing the first binary data values to all the memory cells in the array, and thereafter performs n*m cell accesses in reading the same data. The tester must once again perform n*m accesses in writing data having a second binary value to each memory cell, and the same number of accesses in reading this data. The tester thus performs a total of four times n*m cell accesses, each of which requires a bus cycle to perform.

Data compression has been used by some testers to reduce the number of bus cycles required to test memory cells. Data compression generally relies on some means of quickly writing data to the memory cells of the memory device, and then reducing the amount of data that must be read from the memory device to indicate a pass or a fail condition. For example, sense amplifiers of an SDRAM device may be held at a particular logic level, such as a level corresponding to a binary "1" value, and the rows of memory cells sequentially activated, thereby quickly writing a binary value of "1" to each of the memory cells in the array. When data is read from the memory device, the binary values from all of the memory cells or groups of memory cells can be applied to an AND gate or other logic circuit. The logic circuit outputs a logic "1" if all of the memory cells in the row properly function to store the correct binary value. A similar process can then be used to write a binary value of "0" to all of the memory cells and then read the values stored in the memory cells. The results of reading each row can then be combined by conventional means so that the memory device will output a single binary value indicating either a pass or a fail condition.

In addition to compressed data testing of memory, semiconductor memory systems typically include logic to detect errors internally for correction. In general, error detection logic circuits are used to maintain the integrity of data stored in the memory array. When data are written to or read from memory, a calculation is performed on the data to produce or identify an error correction code ("ECC"). Both the code and data are stored, and the code is used to detect errors when the read data is compared to the data previously written. One type of error detection code generates parity bits for each data word written to memory. The parity bits are chosen so that the sum of the data and the parity bits are even. When the data word and parity bits are read from memory, the sum of the data word and the parity bits is determined. If the sum of the data word and the parity bits is an even number, then no error is detected. If one of the parity bits or one of the bits of the data word is in error, the sum of the data word and parity bits is an odd number. Although parity bits can be used to determine if the read data word contains an error, parity bits alone cannot be used to correct the error. A series of equations are derived using the parity bit configurations for generating ECC check bits particular to the data word being written to memory. The ECC check bits are written along with the data. When the data and check bits are read, the ECC logic detects the error by comparing the ECC check bits read from memory with ECC check bits calculated from the data read from memory. If no errors are detected, the read data are output from the memory device. If an error is detected, the ECC logic uses the read ECC check bits to correct the read data, and the corrected read data are output from the memory device. If too many bits of the read data are in error to be corrected, then the condition may be reported.

Hamming codes are conventional ECCs commonly use to detect and correct bit errors in a data word. The number of ECC bits for Hamming codes is determined by the total number of bits in the data and by the number of data bit errors that can be corrected. For example, an eight data bit word typically requires four check bits to correct a single bit error in the word, creating an ECC encoded word 12 bits in length. A conventional 8,4 Hamming code having eight data bits D0-D7 and four ECC bits P0-P3 is shown in FIG. 1A. To generate an ECC bit, the cells in that particular row having an assignment of "1" are x-or'ed together. All positions associated with each cell having an assignment of "1" are combined to define the parity equation for that particular ECC bit. For example, the equation for ECC bit P0 is determined by all positions having an assignment "1" in the first row. As a result, the equation for ECC bit P0 includes positions D0, D1, D3, D4, and D6. The equations for all ECC check bits P0-P3 are defined in the same manner, using the 8,4 Hamming code matrix of FIG. 1A, and are shown in FIG. 1B.

FIG. 2 illustrates a memory system 250 that may include the conventional Hamming code error correction scheme described above. The memory system 250 includes a memory array 270, a write bus 243, and a read bus 233. Input buffers 249 and input registers 248 receive eight bits of write data DQ<0:7>. Write FIFO 246 check and control the write data before transmitting to an ECC encoder 242. In the conventional memory system 250 having an error correction logic, the encoder 242 calculates ECC bits corresponding to the data before writing the data bits plus the ECC bits to the memory array 270. When data are read from the memory array 270, the read data and ECC bits are received by an ECC decoder 232 coupled to the memory array 270 by the read bus 233. The ECC decoder 232 calculates new ECC bits from the read data and compares the new ECC bits to the ECC bits read from the memory array 270. If the ECC bits match, no errors are considered to exist in the read data. If the ECC bits do not match, the ECC bits read from the memory array 270 are used to correct the read data. The read data are then transmitted on to a read latch 234, and then passed on to drivers 238 to be sent out as read data DQ<0:7>.

Conventional error detection methods such as those used in the memory system 250 of FIG. 2, become inadequate when having to test the entire memory array 270. As described previously, every memory cell in the array 270 must be read and checked for data errors during device testing. Checking the data stored in the memory cells requires a substantial period of time primarily because of the time required to generate ECC bits from the read data using the equations shown in FIG. 1B. Once the ECC bits have been generated, they must be compared to the ECC bits read from the memory array 270, which are used to correct any data errors that are found, as previously explained. As the number of memory cells in memory arrays is now very large and continues to increase, a substantial amount of the time is required to test all of the memory cells in the array 270.

Therefore, there is a need for an alternative approach to using ECC systems in order to reduce testing time when testing a large amount of data, such as data read from the memory cells of a large memory device or of several memory devices.

SUMMARY OF THE INVENTION

A system and method of testing a memory cell array includes an input logic circuit that receives input data bits and generates test data bits having a first pattern corresponding to the value of a subset of the input data bits. A selector then applies to an ECC encoder the input data bits in a normal operating mode and the test data bits in a test mode. The ECC encoder generates ECC check bits having a value corresponding to the value of the selected data bits. The ECC encoder may generate ECC bits that are all "1" if the selected data bits are all "1," and it may generate ECC bits that are all "0" if the selected data bits are all "0." The selected data bits and the corresponding ECC bits are then written to a memory cell array. The data bits and corresponding ECC check bits are subsequently read from the memory cell array. In the normal operating mode, the read data bits and corresponding ECC check bits are applied to an ECC decoder. The ECC decoder uses the received ECC check bits to check the received data bits and, if any of the received data bits are in error, to correct the received data bits to provide correct data bits. In the test mode, the read data bits and corresponding ECC check bits are checked by an output logic circuit to determine if the read data bits and ECC check bits have a second pattern corresponding to the value of the subset of the input data bits. The output logic circuit generates at least one test result bit having a value indicative of the read data bits and ECC check bits having the second pattern. Finally, a selector circuit outputs the correct data bits in the normal operating mode and the at least one test result bit in the test mode.

BRIEF DESCRIPTION OF THE DRAWINGS

FIG. 1A is a conventional table for an 8,4 Hamming Code.

FIG. 1B is a set of ECC equations for calculating ECC bits according to the table of FIG. 1A.

FIG. 3A is a table for an 8,4 Hamming Code according to one example of the invention.

FIG. 3B is a set of ECC equations for calculating ECC bits according to the table of FIG. 3A.

DETAILED DESCRIPTION

Embodiments of the present invention are directed to a test system to reduce testing time during the testing of integrated circuit devices, such as memory devices. In the following description, certain details are set forth below to provide a sufficient understanding of the invention. However, it will be clear to one skilled in the art that the invention may be practiced without these particular details. In other instances, well-known circuits, control signals, timing protocols, and software operations have not been shown in detail or omitted entirely in order to avoid unnecessarily obscuring the invention.

Embodiments of the present invention make use of revisions to the 8,4 Hamming code shown in FIG. 3A to design an ECC logic circuit capable of generating ECC bit equations for operation in testing mode (when the device is being tested), and normal operation mode (when data stored to memory are checked). The original ECC equations previously shown in FIG. 1A allow for ECC bits of all "0" to be generated when the data are all "0," but do not generate ECC bits of all "1" when the data are all "1." The revised ECC table of FIG. 3A contains changes to the matrix for data bits labeled D0-D7 of the original Hamming Code table previously shown in FIG. 1A. In addition to generating ECC bits in the same manner as the conventional ECC equations, the new revisions now allow for ECC bits of all "1" to be generated when the data are all "1." In the revised Hamming Code table of FIG. 3A, the first row includes data bit position D4 labeled a "0" and D5 labeled a "1." The second row reflects changes to data bit positions D0 and D5 to "0," and positions D1 and D7 to "1." The third row includes bit positions D2 and D3 changed to "0," and bit positions D0, D4 and D5 changed to a "1." In the fourth row, bit positions D0, D1, D2 and D3 are changed to a "1," and data bit positions D5, D6, and D7 are changed to a "0." With the new assignments made to the data bit positions in FIG. 3A, new equations are generated for calculating ECC bits P0-P3 as illustrated in FIG. 3B. As described previously, the ECC equations for each ECC bit are generated by x-or'ing all the data bits assigned to "1" for each respective row. The ECC bit P0 is now generated by x-or'ing D0, D1, D3, D5 and D6, where D5 replaces D4 in the original equation. ECC bit P1 is calculated by x-or'ing D1, D2, D3, D6 and D7, where D1 replaces D0, D6 replaces D5, and D7 replaces D6 in the original equation, respectively. ECC bit P2 is now calculated by x-or'ing D0, D1, D4, D5 and D7. ECC bit P3 is calculated by x-or'ing D0, D1, D2, D3 and D4.

Figure 4:
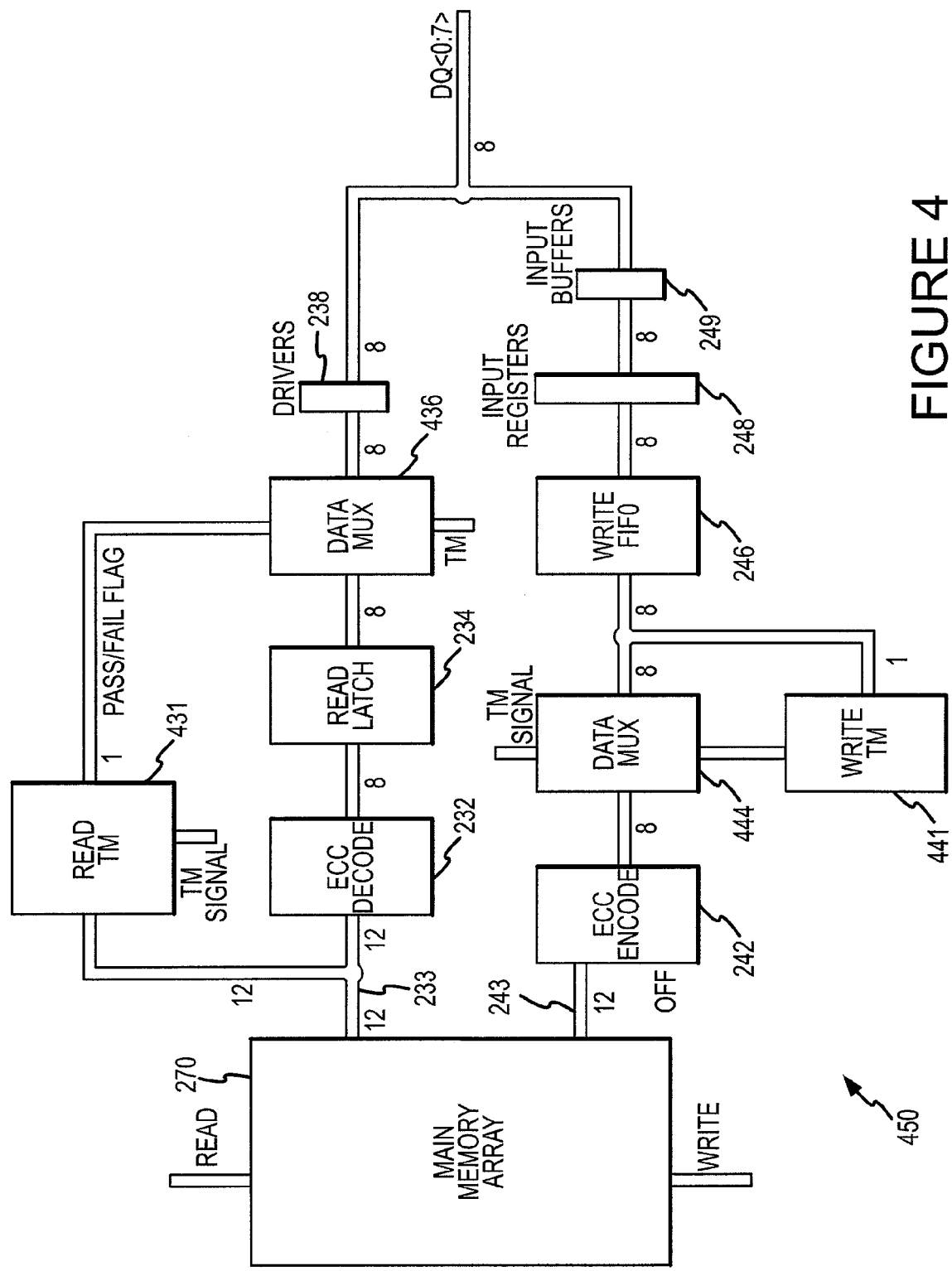
FIG. 4 is a block diagram of a memory system that includes an ECC system using ECC check bits generated according to the ECC equations shown in FIG. 3B.

FIG. 4 illustrates a memory device 450 according to one example of the present invention, and contains an ECC system that includes the revised ECC equations shown in FIG.

Figure 2:
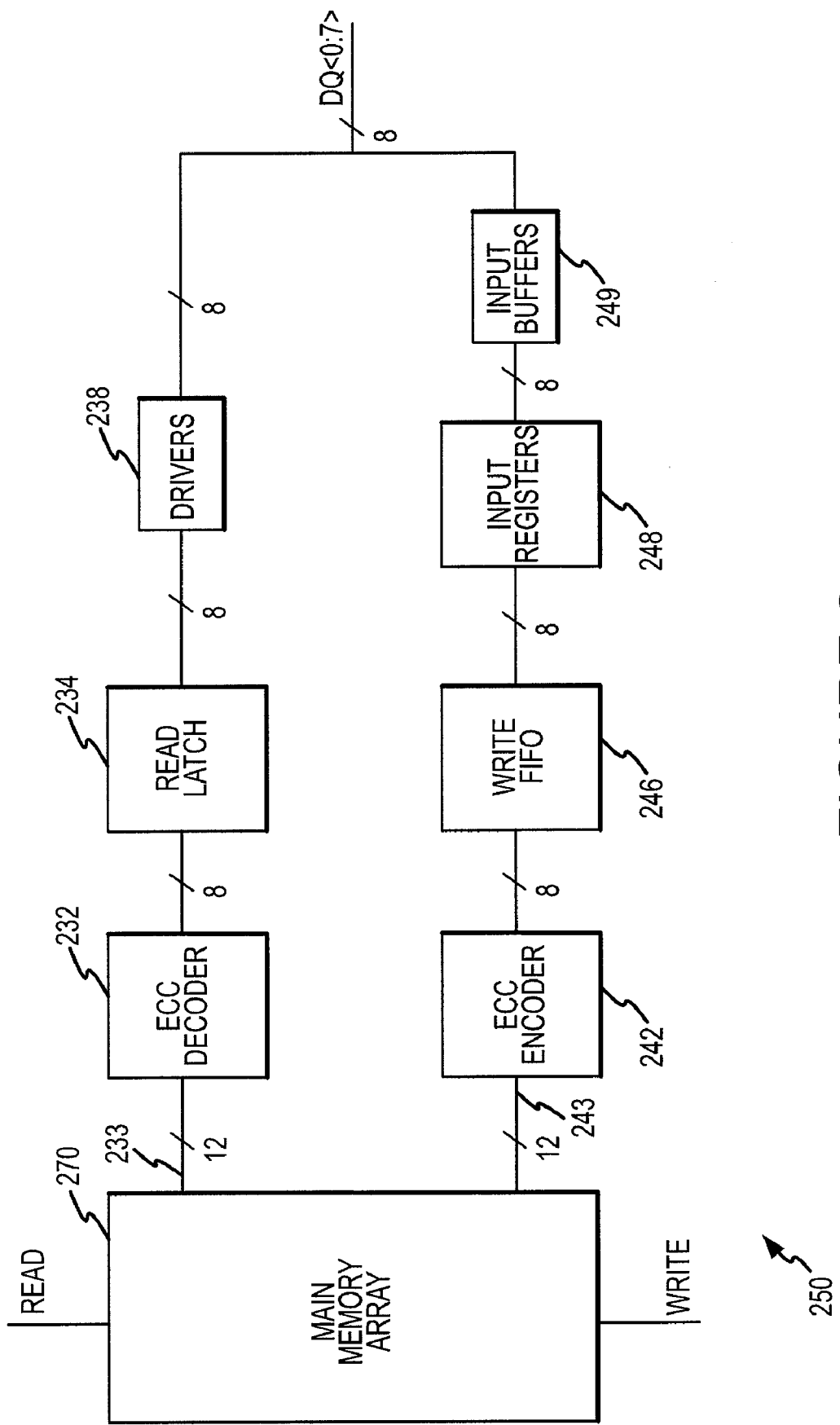
FIG. 2 is a block diagram of a memory system with a conventional error correction system.

3B. As already described, there are two modes of operation in the device 450, a normal mode of operation and a testing mode of operation. During the normal mode, the ECC system functions like the conventional ECC system where all eight bits of DQ <0:7> are considered valid and data are transferred, as explained above, with reference to the system illustrated in FIG. 2. Specifically, during normal operation, the input buffers 249 receive write data bits DQ<0:7> and set up the data bits in a manner that it is compatible with the ECC system logic. The input registers 248 coupled to the input buffers 249 receive the write data from the input buffers 249, where the data is latched and held for one clock cycle. Coupled to the input registers 248 is the write FIFO 246, which includes drivers to temporarily store and maintain write data in a first-in-first-out manner as they are received. The input registers 248 and write FIFO 249 primarily work together to synchronize the write data according to the instructions of the command logic as data are written to memory. The write FIFO 246 is next coupled to a write data multiplexer 444. In the normal mode, the write data multiplexer 444 transfers write data from the write FIFO 249 to the ECC encoder 242. ECC bits are generated by the ECC encoder 242 using the revised ECC equations of FIG. 3B. As previously explained, the number of ECC check bits generated depend on the total number of bits and the number of possible errors to correct in the data. Once write data are encoded with ECC check bits, the write data plus ECC bits are written to the memory array 270.

Once written to the memory array 270, data are now ready to be read from the memory array 270 and checked for errors. Continuing with the system in normal mode of operation, the data plus ECC bits are read from the memory array 270 and received by the ECC decoder 232. The ECC bits are used to check and correct any errors. The read data are then sent out to the read latch 234, which is coupled to the decoder 232, and the read data are latched as determined by the command logic. A read data multiplexer 436 is coupled to the read latch 234, and in the normal mode of operation the data multiplexer 436 passes the read data from the read latch 234 to the read drivers 238 for sending out as read data DQ<0:7>.

During the testing mode of operation, the test components of the ECC system are enabled by asserting the TM signal thereby disabling the normal mode of operation. The test components include a write test mode ("TM") logic circuit 441 and a read TM logic circuit 431. During the testing mode, a predetermined bit, such as the D0 bit, from one of the bits in the data word is defined as a valid bit and the data containing the valid bit are received by the input buffers 249. The remaining bits are then irrelevant to the system. The system may alternatively receive a single valid bit instead of the entire 8-bit data. The input buffers 249, the input registers 248 and the write FIFO 246 during testing mode operate in the same manner as in the normal mode of operation. The write TM logic circuit 441 receives and selects the valid bit from the data from the write FIFO 246, and outputs the same value to all remaining bits of the write data. As a result, the write test data contains the same number of bits as the write data initially received by the memory device 450. For example, if the system receives an 8-bit data word and if the valid bit is a "1," then the write test data would be 8-bits in length comprising of eight "1" bits. If only a single bit is received by the write TM logic circuit 441, then the value of the single bit is used for all 8-bits of the test data. As mentioned above, if the system is in testing mode, the TM signal has been asserted. The TM signal is applied to the write data multiplexer 444, indicating it to pass on the test data sent by the write TM logic circuit 441 instead of data from the write FIFO 246. The write data multiplexer 444 therefore receives the write test data and transfers the test data to the encoder 242. For example, if the single valid bit received by the memory device 450 is a "1," then the write TM logic circuit 441 applies eight "1" bits to the multiplexer 444. The ECC encoder 242 receives the test data of eight "1" bits and generates four check bits of "1," and the eight test bits plus four check bits are then written to memory.

Once the test data and ECC check bits are written to the memory array 270, they may be read from the memory array 270 to determine whether errors occurred after the write operation. During the testing mode, read data and ECC check bits are received from the memory array 270 by both the read TM logic circuit 431 and the ECC decoder 232. However, the read data multiplexer 436, which also receives the TM signal during testing mode, passes on the data from the read TM logic circuit 431 to the drivers 238, and not read data from the read latch 234. The read TM logic circuit 431 receives eight data bits plus four ECC bits, all being "1" or "0," as long as no errors have occurred. The 12 bits are then compressed to a single bit "1" or "0," indicating a pass or a fail condition during the memory array test. For example, if the read data and ECC check bits are all "1" indicative of a pass condition, the TM logic circuit 431 outputs a bit having a value of "1." Alternatively, if the read data and ECC check bits are all "0," which is also indicative of a pass condition, the TM logic circuit 431 outputs a bit having a value of "0." If the read data and ECC check bits are other than all "0" or all "1," a fail condition is indicated. However, generally only a few bits will fail. In such case, all but a few of the bits will be "0" if the valid bit received by the memory device was a "0." In such case, the TM logic circuit 431 will signify a fail condition by outputting a bit having a value of "1." If the valid bit received by the memory device was a "1," all but a few of the bits will be "1." In such case, the TM logic circuit 431 will signify a fail condition by outputting a bit having a value of "0." The read data multiplexer 436 coupled to the read TM logic circuit 431 receives the single bit and sends it to the read drivers 238 to send out as a single bit of read test data DQ<0:7>. The compressed read test data bit is preferably the same data bit DQ<0:7> as the bit chosen to be the valid bit written to the memory device during the test mode. Therefore, regardless of the value of the valid data bit, the valid data bit read will be the same as the valid data bit written if there is no data error. However, other bit arrangements are also possible.

It will be appreciated that although previous sections describe a preferred embodiment of an ECC system test method using a predetermined test data set of all "1" or all "0," other test data configurations may also be used. For example, the write TM logic circuit 441 may generate predetermined test data having an alternating "1" and "0" pattern. If the single valid bit received by the write TM logic circuit 441 is a "0," the pattern generated by the write TM logic circuit 441 is "01010101." If the single valid bit received by write TM logic circuit 441 is a "1," the pattern generated by the write TM logic circuit 441 is "10101010." This checkerboard type pattern is useful during testing of the memory device, not only for detecting memory cells defectively held in a high or low state, but also for detecting electrical shorts in adjacent memory cells. During the read operation, the read TM logic circuit 431 must be able to detect that the read data plus ECC check bits match the pattern written to the array 270. If the checkerboard pattern started with a "0," the read TM logic circuit 431 outputs a "0" to signal a pass condition and a "1" to signal a fail condition. If the checkerboard pattern started with a "1," the read TM logic circuit 431 outputs a "1" to signal a pass condition and a "0" to signal a fail condition. However, test data patterns comprising of a homogenous set of data are preferred because test data patterns of all "1" or all "0" make it easier to assign matching ECC check bits and make it easier for the read TM logic circuit 431 to detect that the pattern of data and ECC check bits read from the array 270 match the pattern of data and ECC check bits written to the array 270.

Figure 5:
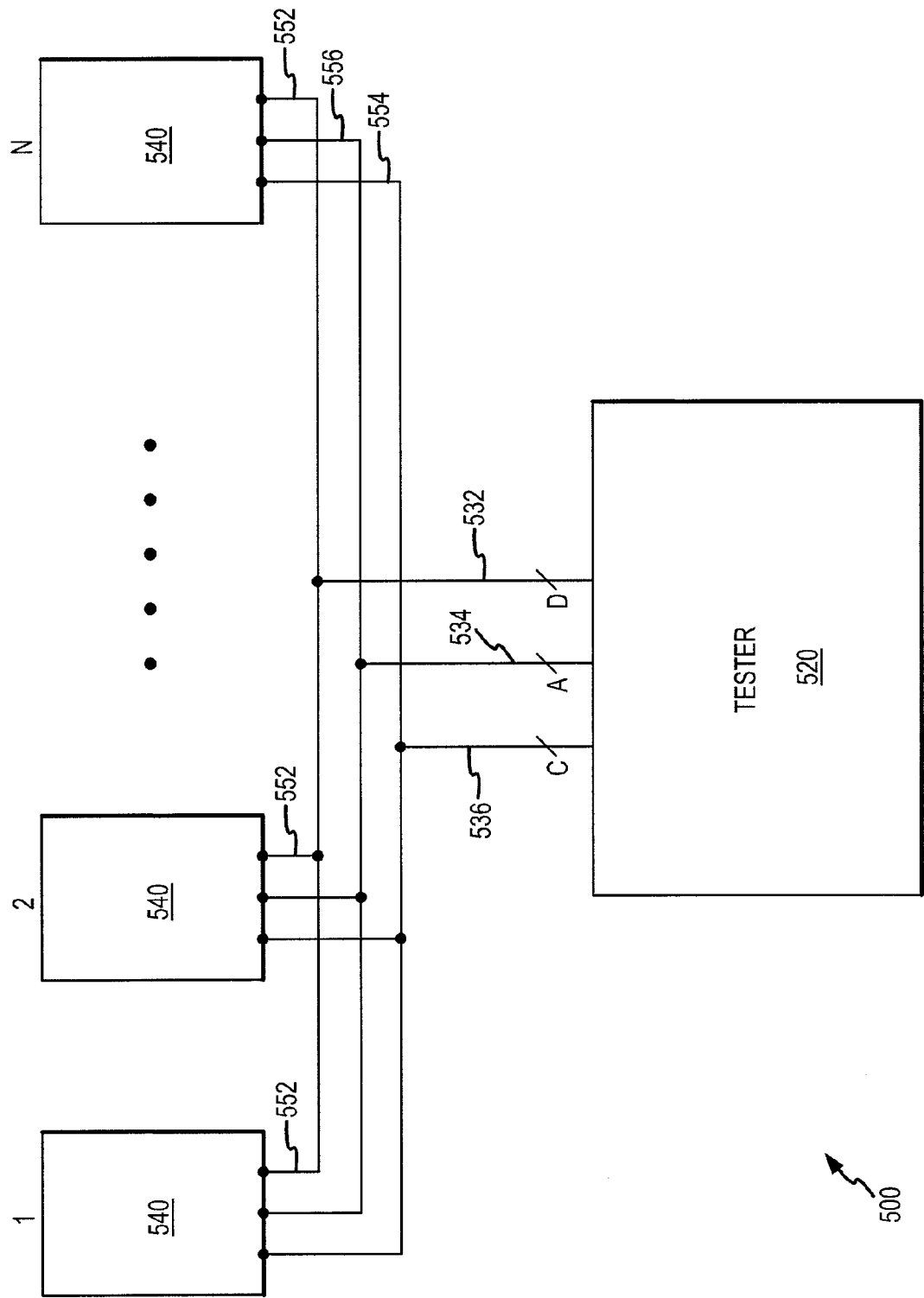
FIG. 5 is a block diagram of a memory device tester coupled to a plurality of memory devices where each memory device includes the ECC system of FIG. 4.

FIG. 5 shows one example of a memory device testing system 500 for testing a plurality of memory devices 540 using an external memory device tester 520. In general, the number of memory devices the memory tester 520 can test is limited by the I/O ports available on the tester 520. This limitation can be represented by the equation n=x/y, where n is the number of memory devices that can be tested, x is the total number of I/O ports made available by the tester and y is the total number of DQ that require testing per memory device. For example, if a tester had 64 I/O ports, and each memory device being tested had an 8-bit data bus, then according to the equation above, only eight memory devices may be tested at a time with the particular tester. The new ECC system in the memory device 450 of FIG. 4 may be used to expedite device testing by allowing more devices to be simultaneously tested at one time. For example, if the eight data bits required to test the device can be tested internally as in the sample memory device 540 previously described, and the test report can be compressed to a single bit indicating a pass or fail condition, then the eight I/O ports previously required from the tester 520 for each memory device 540 can be used to test eight separate memory devices. Therefore, a memory device tester with 64 I/O ports, as in the example provided, is capable of testing 64 memory devices at one time instead of only eight.

FIG. 5 illustrates an N number of memory devices 540 that may be connected to a conventional tester 520 by a data bus 532 having an N number of bits. The N number of bits of data bus 532 corresponds to the number of data ports available on the tester 520 for testing N number of memory devices 540. The tester 520 transmits test data N bits in length on data bus 532. While the tester sends out N bits of data, each memory device 540 receives only one bit of the N test data respectively, and the bit is received on the same data bus terminal for each memory device 540. For example, the tester 520 may have an 8-bit data bus 532 for bits D0-D7. Then the first memory device 540 receives test data bit D0 as D0 in the device, the second memory device 540 receives test data bit D1 as D0 in the device, the third memory device 540 receives test data bit D2 as D0 in the device, and so on. The testing mode of operation, as previously described, is initiated in the ECC system of the memory device 540 when a predetermined valid bit is received. After test data has been written to and read from memory, each memory device 540 outputs a pass or fail condition as either a "1" or "0" bit to the tester. Additionally shown is a control bus 534 and an address bus 536 coupled to each memory device. The control bus 534 provides command information to and from the memory devices 540, such as the TM signal. The control bus 534 is coupled to each memory device 540 by device control bus 554. The address bus 534 carries address information for executing commands to and from the memory devices 540. The address bus 534 is coupled to each memory device 540 by address bus 556. Accordingly, FIG. 5 illustrates a plurality of memory devices 540 tested at one time, the number of devices being limited only by the number of available I/O ports of the external tester 520.

Although the simplest test data to administer by the tester 520 is a data pattern of all "0" or all "1," other test data patterns may be used. For example, if a test data pattern of all "1" bits is used, then each memory device 540 coupled to the tester 520 receives a test bit "1" as their D0 bit. The tester 520 then seeks a return test bit value "1" from each working memory device 540, and determines a malfunction in the memory device 540 if a return test bit value "0" is received. Other test data patterns and pass or fail bit indicators are possible as previously described. Since the tester 520 determines whether the data received from each memory device 540 matches the data sent by each memory device 540, the actual data pattern provided by the tester 520 can be arbitrary.

Figure 6:
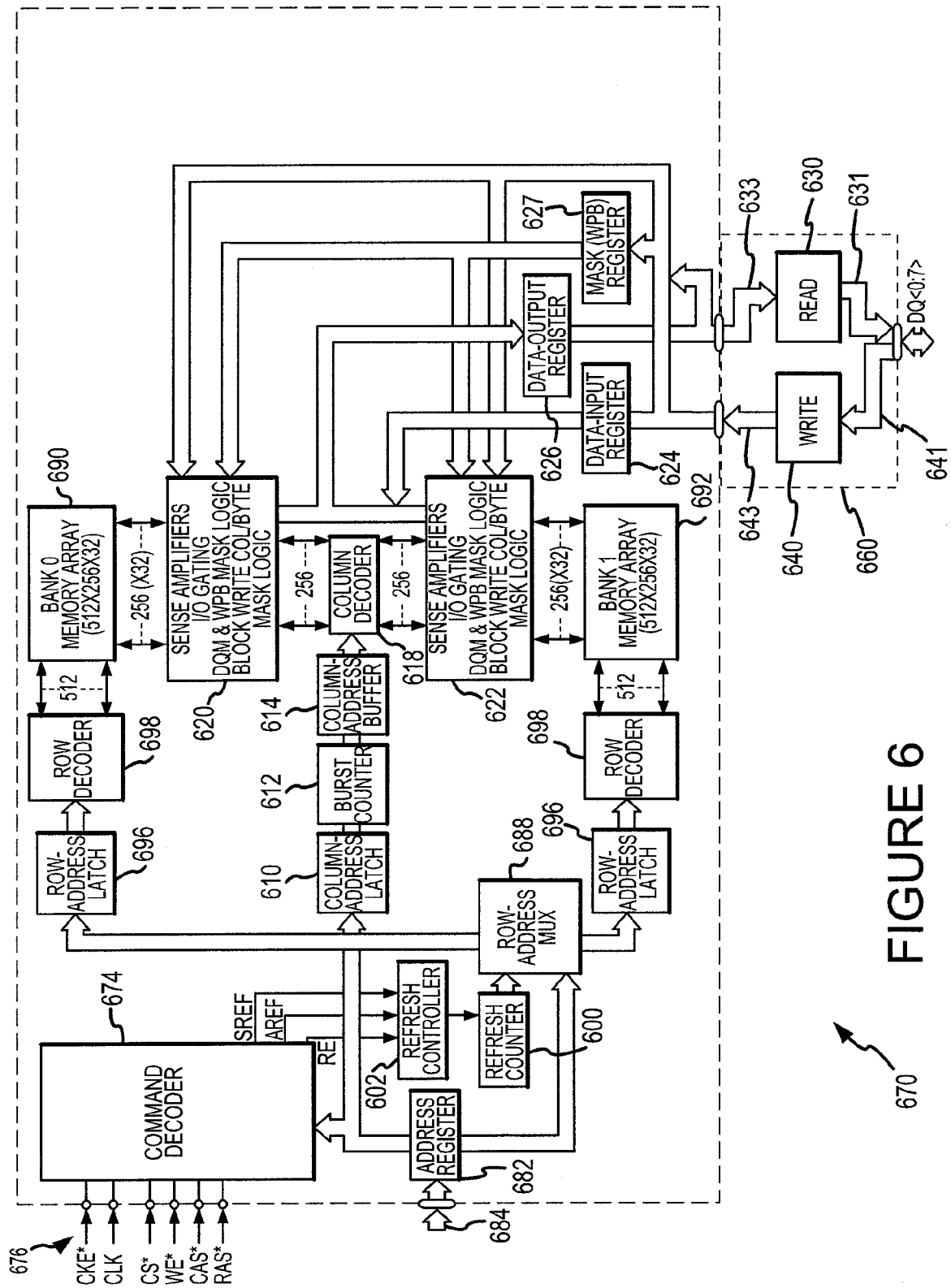
FIG. 6 is a block diagram of a synchronous memory device including the ECC system of FIG. 4.

An embodiment of a memory device that can advantageously use an embodiment of the ECC system in accordance with the present invention is illustrated in FIG. 6. The memory device shown in FIG. 6 is a synchronous dynamic random access memory ("SDRAM") 670, although the ECC system may also be used in other DRAMs and other memory devices. The SDRAM 670 includes an address register 682 that receives either a row address or a column address on an address bus 684. The address bus 684 is generally coupled to a memory controller (not shown in FIG. 6). Typically, a row address is initially received by the address register 682 and applied to a row address multiplexer 688. The row address multiplexer 688 couples the row address to a number of components associated with either of two memory banks 690, 692, depending upon the state of a bank address bit forming part of the row address. Associated with each of the memory banks 690, 692 is a respective row address latch 696, which stores the row address, and a row decoder 698, which applies various signals to its respective memory bank 690 or 692 as a function of the stored row address. The row address multiplexer 688 also couples row addresses to the row address latches 696 for the purpose of refreshing the memory cells in the memory banks 690, 692. The row addresses are generated for refresh purposes by a refresh counter 600, which is controlled by a refresh controller 602.

After the row address has been applied to the address register 682 and stored in one of the row address latches 696, a column address is applied to the address register 682. The address register 682 couples the column address to a column address latch 610. Depending on the operating mode of the SDRAM 670, the column address is either coupled through a burst counter 612 to a column address buffer 614, or to the burst counter 612, which applies a sequence of column addresses to the column address buffer 614 starting at the column address that is stored in the column-address latch. In either case, the column address buffer 614 applies a column address to a column decoder 618, which applies various column signals to respective sense amplifiers and associated column circuitry 620, 622 for the respective memory banks 690, 692.

Data to be read from one of the memory banks 690, 692 are coupled to the column circuitry 620, 622 for one of the memory banks 690, 692, respectively. The data are then coupled to a data output register 626, which applies the data to a data bus 633. Data to be written to one of the memory banks 690, 692 are coupled from the data bus 643 through a data input register 624 to the column circuitry 620, 622 and then are transferred to one of the memory banks 690, 692, respectively. A mask register 627 may be used to selectively alter the flow of data into and out of the column circuitry 620, 622, such as by selectively masking data to be read from the memory banks 690, 692.

SDRAM 670 also includes an ECC system 660 for checking and correcting memory data comparable to the ECC system of the present invention. The ECC system 660 may also be operable to test the memory device SDRAM 670 and facilitate the operations of an external memory device tester. The SDRAM 670 is coupled to the ECC system 660 by a write bus 643 and a read bus 633. Data is transferred by the write bus 643 to be written to memory banks 690, 692. Data written to SDRAM 670 is processed and encoded with ECC checkbits such as the ECC bits generated as shown in FIGS. 1B and 3B by a write operation circuit 640, according the methods previously described. The write operation circuit 640 receives data DQ<0:7> from an input data bus 641 coupled to an external data bus 628. Data encoded with ECC check bits are read from SDRAM 670 onto the ECC system 660 by the read bus 633. A read operation circuit 630 coupled to the read bus 633 receives the read data plus the ECC bits and checks or corrects the read data according to the methods described above. The read data are then applied to an output data bus 631 to send out as DQ <0:7> onto the external data bus 628.

The above-described operation of the SDRAM 670 is controlled by a command decoder 674 responsive to high level command signals received on a control bus 676. These high level command signals, which are typically generated by a memory controller (not shown in FIG. 6), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 674 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

It will be appreciated that while this discussion mentions only two memory banks 690, 692, four, eight etc. memory banks 690, 692 may be coupled together to provide a greater degree of data compression. It will also be appreciated that, while this discussion is in terms of compressing data from multiple memory banks, data from multiple columns (or rows) within one memory bank may be compressed in a similar manner.

Figure 7:
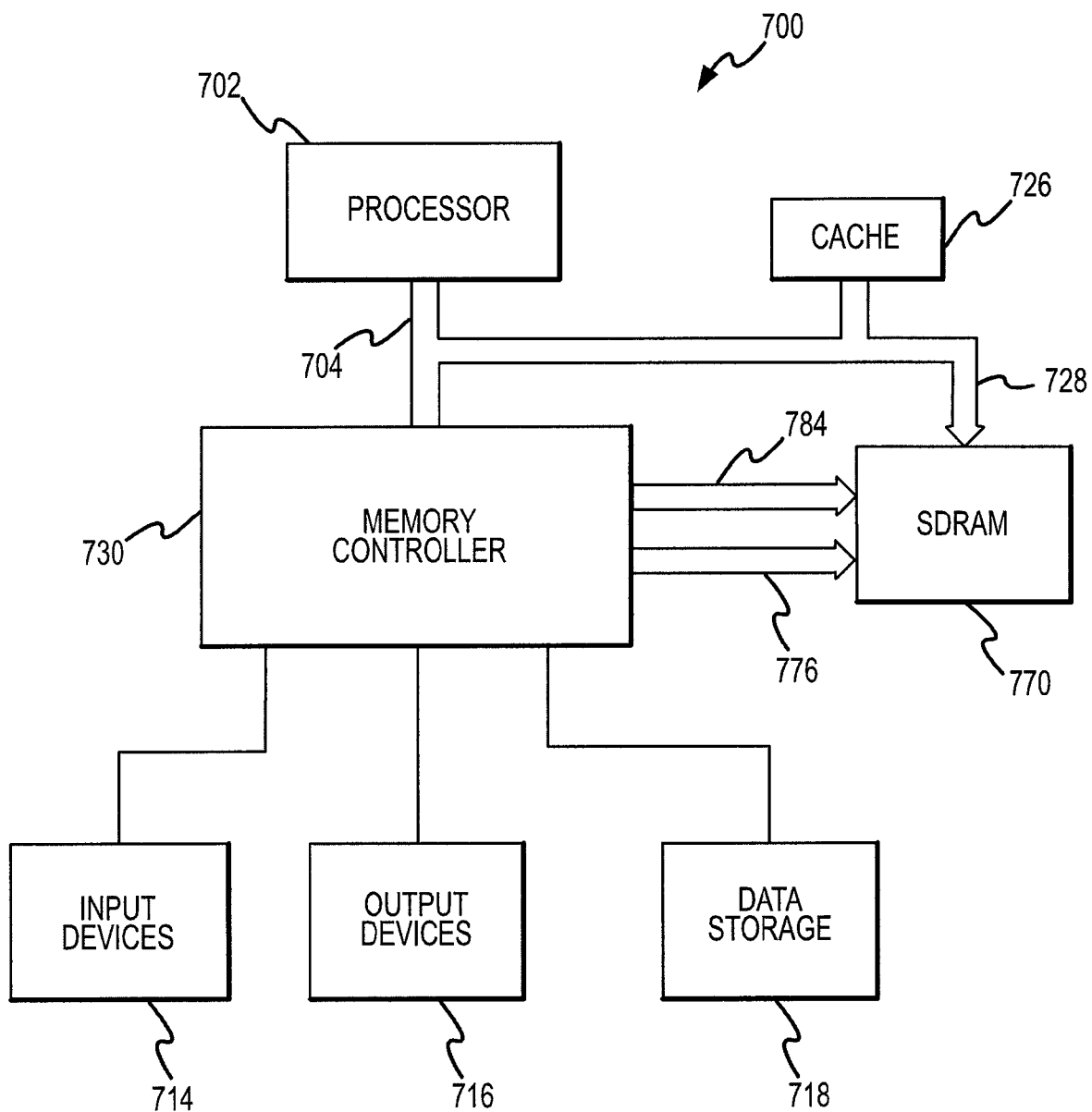
FIG. 7 is a block diagram of a processor-based system including the memory device of FIG. 5.

FIG. 7 is a block diagram of a computer system 700 which includes the SDRAM 770 comparable to SDRAM 670 and ECC system 650 of FIG. 6. The computer system 700 includes a processor 702 for performing various computing functions, such as executing specific software to perform specific calculations or tasks. The processor 702 includes a processor bus 704 that normally includes an address bus 784, a data bus 728, and a control bus 776. In addition, the computer system 700 includes one or more input devices 714, such as a keyboard or a mouse, coupled to the processor 702 to allow an operator to interface with the computer system 700. Typically, the computer system 700 also includes one or more output devices 716 coupled to the processor 702, such output devices typically being a printer or a video terminal. One or more data storage devices 718 are also typically coupled to the processor 702 to allow the processor 702 to store data or retrieve data from internal or external storage media (not shown). Examples of typical storage devices 618 include hard and floppy disks, tape cassettes and compact disk read-only memories (CD-ROMs). The processor 702 is also typically coupled to cache memory 726, which is usually static random access memory ("SRAM") and to the SDRAM 770 through a memory controller 730. The memory controller 730 normally includes the control bus 776 and the address bus 784 that is coupled to the SDRAM 770. The data bus 728 may be coupled to the processor bus 704 either directly (as shown), through the memory controller 730, or by some other means.

Although the present invention has been described with reference to a preferred embodiment, the invention is not limited to this preferred embodiment. Rather, the invention is limited only by the appended claims, which include within their scope all equivalent devices or methods which operate according to the principles of the invention as described.

What is claimed is:

1. A data path circuit, comprising:
   an input logic circuit receiving input data, the input logic circuit being structured to generate input test data having a value corresponding to a value of a subset of bits of the input data;
   a first selector coupled to receive the input data and the input test data, the first selector being structured to select the input data in a normal operating mode and the test data in a test mode;
   an ECC encoder receiving the selected data from the first selector and being operable to generate ECC check bits having a value corresponding to the value of the selected data, the ECC encoder outputting the selected data and the ECC check bits as data path output data, the ECC encoder being structured to generate the ECC check bits so that the ECC check bits have a pattern corresponding to the value of the selected data;
   an ECC decoder receiving data path input data containing data and ECC check bits, the ECC decoder being structured to check and correct the received data based on the received ECC check bits and to output corrected data; and
   an output logic circuit receiving the data path input data, the output logic circuit being structured to determine if bits of the data path input data have a pattern that corresponds to the value of the subset of bits of the input data and to generate test results data indicative of whether the data path input data has a pattern that corresponds to the value of the subset of bits of the input data; and
   a second selector coupled to receive the corrected data and the test results data, the second selector being structured to select the corrected data in the normal operating mode and the test results data in the test mode, the second selector outputting the selected data from the data path circuit.

2. The data path circuit of claim 1 wherein the subset of bits of the input data comprise a single bit, wherein the input logic circuit is structured to generate test data in which all of the bits of the test data have a value of "1" responsive to the single bit having a value of "1," and wherein the ECC encoder is structured to generate the ECC check bits each having a value of "1" responsive to all of the test data bits having a value of "1."

3. The data path circuit of claim 2 wherein the test result data generated by the output logic circuit comprises a single bit, and wherein the output logic circuit is structured to generate the single bit with a value of "1" if the output logic circuit determines that all of the bits of the data path input data have a value of "1," and to generate the single bit with a value of "0" if the output logic circuit determines that any of the bits of the data path input data have a value of "0."

4. The data path circuit of claim 1 wherein the input logic circuit is structured to generate test data in which all bits of the test data have identical values.

5. The data path circuit of claim 1 wherein the subset of bits of the input data comprise a single bit of the input data.

6. The data path circuit of claim 5 wherein the single bit in the subset of bits of the input data comprises the least significant bit of the input data.

7. The data path circuit of claim 5 wherein the test results data comprises a single bit of test results data, and wherein the single bit of test results data is the same bit as the single bit of input data in the subset of bits of the input data.

8. The data path circuit of claim 5 wherein the input logic circuit is structured to generate test data having bits that are identical to each other and to the single bit of the input data.

9. The data path circuit of claim 1 wherein the test results data comprises a single bit of test results data.

10. The data path circuit of claim 1 wherein the ECC encoder is structured to generate ECC check bits that are all "1" for selected data having bits that are all "1," and that are all "0" bits for selected data having bits that are all "0."

11. The data path circuit of claim 1 wherein the input logic circuit is structured to generate a number of bits of test data that is equal to the number of bits in the input data.

12. A memory device comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals; and
a data path extending between a plurality of externally accessible data bus terminals and the memory array for coupling data signals to and from the memory array, the data path comprising:
an input logic circuit receiving input data through the externally accessible data bus terminals, the input logic circuit being structured to generate input test data having a value corresponding to a value of a subset of bits of the input data;
a first selector coupled to receive the input data and the input test data, the first selector being structured to select the input data in a normal operating mode and the test data in a test mode;
an ECC encoder receiving the selected data from the first selector and being operable to generate ECC check bits having a value corresponding to the value of the selected data, the ECC encoder coupling the selected data and the ECC check bits to the memory array as write data to be written in the memory array, the ECC encoder being structured to generate the ECC check bits so that the ECC check bits have a pattern corresponding to the value of the selected data;
an ECC decoder coupled to receive read data from the memory array, the read data including data and ECC check bits, the ECC decoder being structured to check and correct the received data based on the received ECC check bits and to output corrected data;
an output logic circuit receiving the read data from the memory array, the output logic circuit being structured to generate test results data indicative of the bits of the read data having a pattern that corresponds to the value of the subset of bits of the input data; and
a second selector coupled to receive the corrected data and the test results data, the second selector being structured to select the corrected data in the normal operating mode and the test results data in the test mode, the second selector being operable to couple the selected data to the externally accessible data bus terminals.

13. The memory device of claim 12 wherein the subset of bits of the input data comprise a single bit, wherein the input logic circuit is structured to generate test data in which all of the bits of the test data have a value of "1" responsive to the single bit having a value of "1," and wherein the ECC encoder is structured to generate ECC check bits each having a value of "1" responsive to all of the test data bits having a value of "1."

14. The memory device of claim 13 wherein the test result data generated by the output logic circuit comprises a single bit, and wherein the output logic circuit is structured to generate the single bit with a value of "1" if the output logic circuit determines that all of the bits of the data path input data have a value of "1," and to generate the single bit with a value of "0" if the output logic circuit determines that any of the bits of the data path input data have a value of "0."

15. The memory device of claim 12 wherein the input logic circuit is structured to generate test data in which all bits of the test data have identical values.

16. The memory device of claim 12 wherein the subset of bits of the input data comprise a single bit of the input data.

17. The memory device of claim 16 wherein the single bit in the subset of bits of the input data comprises the least significant bit of the input data.

18. The memory device of claim 16 wherein the test results data comprises a single bit of test results data, and wherein the single bit of test results data is the same bit as the single bit of input data in the subset of bits of the input data.

19. The memory device of claim 16 wherein the input logic circuit is structured to generate test data having bits that are identical to each other and to the single bit of the input data.

20. The memory device of claim 12 wherein the test results data comprises a single bit of test results data.

21. The memory device of claim 12 wherein the ECC encoder is structured to generate ECC check bits that are all "1" for selected data having bits that are all "1," and that are all "0" bits for selected data having bits that are all "0."

22. The memory device of claim 12 wherein the input logic circuit is structured to generate a number of bits of test data that is equal to the number of bits in the input data.

23. The memory device of claim 12 wherein the memory array comprises a dynamic random access memory array.

24. A processor-based system comprising:
a processor having a plurality of externally accessible terminals coupled to a processor bus;
an input device coupled to the processor through the processor bus adapted to allow data to be entered into the computer system;
an output device coupled to the processor through the processor bus adapted to allow data to be output from the computer system; and
a memory device coupled to the processor through the processor bus, the memory device comprising:
a command decoder receiving memory command signals through externally accessible command input terminals, the command decoder generating memory control signals responsive to predetermined combinations of the command signals;
an address decoder receiving address signals through externally accessible address input terminals, the address decoder generating row and column addressing signals responsive to the address signals;
a memory array from which data are read and to which data are written at locations corresponding the address signals responsive to the memory control signals; and
a data path extending between a plurality of externally accessible data bus terminals and the memory array for coupling data signals to and from the memory array, the data path comprising:

an input logic circuit receiving input data through the externally accessible data bus terminals, the input logic circuit being structured to generate input test data having a value corresponding to a value of a subset of bits of the input data;

a first selector coupled to receive the input data and the input test data, the first selector being structured to select the input data in a normal operating mode and the test data in a test mode;

an ECC encoder receiving the selected data from the first selector and being operable to generate ECC check bits having a value corresponding to the value of the selected data, the ECC encoder coupling the selected data and the ECC check bits to the memory array as write data to be written in the memory array, the ECC encoder being structured to generate the ECC check bits so that the ECC check bits have a pattern corresponding to the value of the selected data;

an ECC decoder coupled to receive read data from the memory array, the read data including data and ECC check bits, the ECC decoder being structured to check and correct the received data based on the received ECC check bits and to output corrected data;

an output logic circuit receiving the read data from the memory array, the output logic circuit being structured to generate test results data indicative of the bits of the read data having a pattern that corresponds to the value of the subset of bits of the input data; and a second selector coupled to receive the corrected data and the test results data, the second selector being structured to select the corrected data in the normal operating mode and the test results data in the test mode, the second selector being operable to couple the selected data to the externally accessible data bus terminals.

25. The processor-based system of claim 24 wherein the subset of bits of the input data comprise a single bit, wherein the input logic circuit is structured to generate test data in which all of the bits of the test data have a value of "1" responsive to the single bit having a value of "1," and wherein the ECC encoder is structured to generate ECC check bits each having a value of "1" responsive to all of the test data bits having a value of "1."

26. The processor-based system of claim 25 wherein the test result data generated by the output logic circuit comprises a single bit, and wherein the output logic circuit is structured to generate the single bit with a value of "1" if the output logic circuit determines that all of the bits of the data path input data have a value of "1," and to generate the single bit with a value of "0" if the output logic circuit determines that any of the bits of the data path input data have a value of "0."

27. The processor-based system of claim 24 wherein the input logic circuit is structured to generate test data in which all bits of the test data have identical values.

28. The processor-based system of claim 24 wherein the subset of bits of the input data comprise a single bit of the input data.

29. The processor-based system of claim 28 wherein the single bit in the subset of bits of the input data comprises the least significant bit of the input data.

30. The processor-based system of claim 28 wherein the test results data comprises a single bit of test results data, and wherein the single bit of test results data is the same bit as the single bit of input data in the subset of bits of the input data.

31. The processor-based system of claim 28 wherein the input logic circuit is structured to generate test data having bits that are identical to each other and to the single bit of the input data.

32. The processor-based system of claim 24 wherein the test results data comprises a single bit of test results data.

33. The processor-based system of claim 24 wherein the ECC encoder is structured to generate ECC check bits that are all "1" for selected data having bits that are all "1," and that are all "0" bits for selected data having bits that are all "0."

34. The processor-based system of claim 24 wherein the input logic circuit is structured to generate a number of bits of test data that is equal to the number of bits in the input data.

35. The processor-based system of claim 24 wherein the memory array comprises a dynamic random access memory array.

36. An assembly of a testing system and a plurality of memory devices being tested comprising:

a tester having a plurality of data I/O ports; and a plurality of memory devices coupled to the tester, each memory device having a plurality of externally accessible data bus terminals, a subset of the data bus terminals of each of the memory devices being coupled to respective data I/O ports of the tester, each of the memory devices comprising:

a command decoder receiving memory command signals through externally accessible command input terminals, the command decoder generating memory control signals responsive to predetermined combinations of the command signals;

an address decoder receiving address signals through externally accessible address input terminals, the address decoder generating row and column addressing signals responsive to the address signals;

a memory array from which data are read and to which data are written at locations corresponding the address signals responsive to the memory control signals; and a data path extending between the data bus terminals and the memory array for coupling data signals to and from the memory array, the data path comprising:

an input logic circuit receiving input data through the data bus terminals, the input logic circuit being structured to generate input test data having a value corresponding to a value of bits of the input data received from the tester through the subset of the data bus terminals that are coupled to respective data I/O ports of the tester;

a first selector coupled to receive the input data and the input test data, the first selector being structured to select the input data in a normal operating mode and the test data in a test mode;

an ECC encoder receiving the selected data from the first selector and being operable to generate ECC check bits having a value corresponding to the value of the selected data, the ECC encoder coupling the selected data and the ECC check bits to the memory array as write data to be written in the memory array, the ECC encoder being structured to generate the ECC check bits so that the ECC check bits have a pattern corresponding to the value of the selected data;

an ECC decoder coupled to receive read data from the memory array, the read data including data and ECC check bits, the ECC decoder being structured to check and correct the received data based on the received ECC check bits and to output corrected data;

an output logic circuit receiving the read data from the memory array, the output logic circuit being structured to generate test results data indicative of the bits of the read data having a pattern that corresponds to the value of bits of the input data received from the tester through the subset of the data bus terminals that are coupled to respective data I/O ports of the tester; and a second selector coupled to receive the corrected data and the test results data, the second selector being structured to select the corrected data in the normal operating mode and to couple the selected data to the externally accessible data bus terminals, the second selector being structured to select the test results data in the test mode and to couple the selected data to the subset of the data bus terminals that are coupled to respective data I/O ports of the tester.

37. The assembly of claim 36 wherein the subset of bits of the input data comprise a single bit, wherein the input logic circuit is structured to generate test data in which all of the bits of the test data have a value of "1" responsive to the single bit having a value of "1," and wherein the ECC encoder is structured to generate ECC check bits each having a value of "1" responsive to all of the test data bits having a value of "1."

38. The assembly of claim 37 wherein the test result data generated by the output logic circuit comprises a single bit, and wherein the output logic circuit is structured to generate the single bit with a value of "1" if the output logic circuit determines that all of the bits of the data path input data have a value of "1," and to generate the single bit with a value of "0" if the output logic circuit determines that any of the bits of the data path input data have a value of "0."

39. The assembly of claim 36 wherein the input logic circuit is structured to generate test data in which all bits of the test data have identical values.

40. The assembly of claim 36 wherein the subset of bits of the input data comprise a single bit of the input data.

41. The assembly of claim 40 wherein the single bit in the subset of bits of the input data comprises the least significant bit of the input data.

42. The assembly of claim 40 wherein the test results data comprises a single bit of test results data, and wherein the single bit of test results data is the same bit as the single bit of input data in the subset of bits of the input data.

43. The assembly of claim 40 wherein the input logic circuit is structured to generate test data having bits that are identical to each other and to the single bit of the input data.

44. The assembly of claim 36 wherein the test results data comprises a single bit of test results data.

45. The assembly of claim 36 wherein the ECC encoder is structured to generate ECC check bits that are all "1" for selected data having bits that are all "1," and that are all "0" bits for selected data having bits that are all "0."

46. The assembly of claim 36 wherein the input logic circuit is structured to generate a number of bits of test data that is equal to the number of bits in the input data.

47. The assembly of claim 36 wherein the memory array comprises a dynamic random access memory array.

48. A method of testing a memory cell array, comprising:

receiving input data bits and generating test data bits having a first pattern corresponding to the value of a subset of the input data bits;

selecting the input data bits in a normal operating mode and the test data bits in a test mode;

using an ECC encoder, generating ECC check bits having a value corresponding to the value of the selected data bits and outputting the selected data and the generated ECC check bits as data path output data;

writing the selected data bits and the corresponding ECC check bits to the memory cell array;

reading data bits and corresponding ECC check bits from the memory cell array;

in the normal operating mode, receiving the read data bits and corresponding ECC check bits, using the received ECC check bits to check the received data bits and, if any of the received data bits are in error, to correct the received data bits to provide correct data bits;

in a test mode receiving the read data bits and corresponding ECC check bits, determining if the read data bits and ECC check bits have a second pattern corresponding to the value of the subset of the input data bits, and generating at least one test result bit having a value indicative of the read data bits and ECC check bits having the second pattern; and selecting the correct data bits in the normal operating mode and the at least one test result bit in the test mode.

49. The method of claim 48 wherein the act of generating test data bits having a first pattern corresponding to the value of a subset of the input data bits comprises generating test data bits having a first pattern corresponding to the value of a single one of the input data bits.

50. The method of claim 49 wherein the act of generating test data bits having a first pattern corresponding to the value of a single one of the input data bits comprises generating test data bits having a first pattern corresponding to the value of the least significant of the input data bits.

51. The method of claim 49 wherein the act of generating test data bits having a first pattern corresponding to the value of a single one of the input data bits comprises generating test data bits that are all "1" responsive to the single one of the input data bits being a "1."

52. The method of claim 51 wherein the act of generating ECC check bits having a value corresponding to the value of the selected data bits comprises generating ECC check bits that are all "1" responsive to the selected data bits that are all "1."

53. The method of claim 49 wherein the act of generating test data bits having a first pattern corresponding to the value of a single one of the input data bits comprises generating test data bits that are all "0" responsive to the single one of the input data bits being a "0."

54. The method of claim 53 wherein the act of generating ECC check bits having a value corresponding to the value of the selected data bits comprises generating ECC check bits that are all "0" responsive to the selected data bits that are all "0."

55. The method of claim 48 wherein the act of determining if the read data bits and ECC check bits have a second pattern corresponding to the value of the subset of the selected data bits comprises determining if the read data bits and ECC check bits are all "1" responsive to the value of the selected data bits being all "1."

56. The method of claim 55 wherein the act of generating at least one test result bit having a value indicative of the read data bits and ECC check bits having the second pattern comprises generating a single test result bit having a value of "1" responsive to the read data bits and ECC check bits all having a value of "1."

57. The method of claim 56 wherein the act of generating at least one test result bit having a value indicative of the read data bits and ECC check bits having the second pattern comprises generating a single test result bit having a value of "0" responsive to any of the read data bits and ECC check bits having a value of "0."

58. The method of claim 48 wherein the act of determining if the read data bits and ECC check bits have a second pattern corresponding to the value of the subset of the input data bits comprises determining if the read data bits and ECC check bits are all "0" responsive to the value of the subset of the input data bits being all "0."

59. The method of claim 58 wherein the act of generating at least one test result bit having a value indicative of the read data bits and ECC check bits having the second pattern comprises generating a single test result bit having a value of "0" responsive to the read data bits and ECC check bits all having a value of "0."

60. The method of claim 59 wherein the act of generating at least one test result bit having a value indicative of the read data bits and ECC check bits having the second pattern comprises generating a single test result bit having a value of "1" responsive to any of the read data bits and ECC check bits having a value of "1."

* * * * *